(12) United States Patent
Ha et al.

(10) Patent No.: US 6,636,609 B1
(45) Date of Patent: Oct. 21, 2003

(54) METHOD AND APPARATUS FOR AUTOMATICALLY COMPENSATING SOUND VOLUME

(75) Inventors: Yeong Ho Ha, Daeku (KR); Kyu Pill Han, Daeku (KR); Kwang Choon Lee, Kumi (KR); Zoong Hee Kim, Kumi (KR); Jae Woo Ko, Kumi (KR); Sung Hoon Choi, Daeku (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/094,449

(22) Filed: Jun. 10, 1998

(30) Foreign Application Priority Data

Jun. 11, 1997 (KR) ............................................. 97-24019
Dec. 17, 1997 (KR) ............................................. 97-70082

(51) Int. Cl.$^7$ ............................. H03G 3/00; H02B 1/00
(52) U.S. Cl. ........................ 381/104; 381/107; 381/123
(58) Field of Search ........................... 381/57, 86, 123, 381/119, 103–108

(56) References Cited

U.S. PATENT DOCUMENTS

| | | | | |
|---|---|---|---|---|
| 4,287,391 A | * | 9/1981 | Queen ............................ | 179/1 |
| 4,484,344 A | * | 11/1984 | Mai et al. ........................ | 381/46 |
| 4,589,138 A | * | 5/1986 | Milner et al. ................... | 381/110 |
| 4,633,501 A | * | 12/1986 | Werrbach ...................... | 381/100 |
| 5,172,358 A | * | 12/1992 | Kimura ....................... | 369/47.26 |
| 5,666,430 A | * | 9/1997 | Rzeszewski ................... | 381/107 |
| 5,706,357 A | * | 1/1998 | Yang ............................ | 381/107 |
| 6,195,438 B1 | * | 2/2001 | Yumoto et al. ................ | 381/103 |

FOREIGN PATENT DOCUMENTS

| | | |
|---|---|---|
| CA | 2159976 | 7/1996 |
| JP | 7-87588 | 3/1995 |

* cited by examiner

*Primary Examiner*—Forester W. Isen
*Assistant Examiner*—Elizabeth McChesney
(74) *Attorney, Agent, or Firm*—Finnegan, Henderson, Farabow, Garrett & Dunner, L.L.P.

(57) ABSTRACT

A method and apparatus for automatically compensating a sound volume are disclosed. The method includes the steps of determining whether a channel conversion key and an audio input switching key are inputted, producing an energy of an audio signal when the channel conversion key is inputted, and comparing an energy value of the audio signal detected for a predetermined time period with an energy value obtained from a previous step thereof and compensating for as much volume as a difference obtained by the comparison. The method together with the apparatus considers a symmetrical characteristic of an audio signal, calculates a voice energy with regard to a half signal of the audio signal, converts the calculated signal to a simplified value, and automatically compensates for the volume accordingly, thereby removing redundant manual steps.

8 Claims, 8 Drawing Sheets

METHOD AND APPARATUS FOR AUTOMATICALLY COMPENSATING SOUND VOLUME

BACKGROUND OF THE INVENTION

1. Field of the Invention

The present invention relates to an audio signal processing technology, and more particularly, to an improved method and apparatus for automatically compensating a sound volume without an additional key manipulation by a user.

2. Description of the Background Art

FIG. 1 is a block diagram illustrating a conventional audio signal processing apparatus for a television set. As shown therein, the apparatus includes a tuning unit 101 for selecting a channel required by a user from a plurality of channels in accordance with high frequency broadcasting signals received through an antenna ANT, a wave detecting unit 102 for receiving an output signal of the tuning unit 101 and restoring a video signal and an audio signal, an input signal selecting unit 103 for outputting to an image processing unit the video signal received from the wave detecting unit 102 and outputting one selected from the audio signal outputted from the wave detecting unit 102 and an external audio signal $EAU_{in}$, a voice control unit 104 for adjusting a sound volume of the audio signal AU output from the input signal selection unit 103 and outputting a resultant signal to a speaker SP, and a microcomputer 105 for controlling respective blocks in accordance with a user selected signal received from a key input unit 106.

The operation of the conventional audio signal processing apparatus will now be described.

First, in case a user intends to watch an areal wave broadcasting, when a required broadcasting channel is input through the key input unit 106, the input signal is applied to the microcomputer 105 which in turn outputs the corresponding control signal to the tuning unit 101.

The tuning unit 101 selects one of a plurality of channels with high frequency broadcasting signals through the antenna ANT, that is, the channel which corresponds to the control signal applied thereto from the microcomputer 105 selected by the user, amplifies the television broadcasting signal of the corresponding channel to a predetermined level, and outputs the amplified signal. Then, the wave detecting unit 102 restores an original video signal and an audio signal from the signal outputted from the tuning unit 101.

The input signal selecting unit 103 transfers the video signal among those outputted from the wave detecting unit 102 to the image processing unit, and the audio signal AU is transferred to the voice control unit 104.

When there is required a playback of an external device through an additional connection line other than the case in which an aerial wave broadcasting is watched, that is, when peripheral devices such as a VCR, CD(compact disc) player, and LD(laser disc) player, are connected to the television set for their playback, a user may carry out the key operation of a corresponding function through the key input unit 106, and the microcomputer 105 recognizes the key operation to thereby apply a control signal CS1 corresponding thereto to the input signal selecting unit 103.

Then, the input signal selection unit 103 selects one from the audio signal or external audio signal $EAU_{in}$ outputted from the wave detecting unit 102 in accordance with the control signal CS1, and outputs the video signal and audio signal to the image processing unit and the voice control unit 104, respectively. The voice control unit 104 receives the audio signal AU outputted from the input signal selecting unit 103, and adjusts the received signal to a volume level required by the user, that is, a volume level in correspondence to the control signal CS2 outputted from the microcomputer 105 so as to be applied to the speaker SP.

As described above, the conventional audio signal processing apparatus has a disadvantage in that a sound volume must be manually adjusted whenever a channel or an input audio source is changed if a user requires a certain level of audio output.

For example, a music signal and a voice signal show differences in frequency characteristic. Music allows an even distribution of frequency so that the music signal may sound larger than real in a human auditory system, whereas voice sounds weaker than music since human voice ranges from 1~5kHz.

Also, in many instances, a volume level tends to be unevenly outputted due to transmission level differences depending on broadcasting stations, receipt sensibility differences depending on districts, and record level differences of recording media, whereby the sound volume has to be manually adjusted by the user.

SUMMARY OF THE INVENTION

The present invention is directed to solution of the conventional disadvantages. Accordingly, it is an object of the present invention to provide a method and apparatus for automatically compensating sound volume, wherein a volume compensation is carried out according to an auditory frequency characteristic of human in consideration of a loudness curve, and a voice energy is calculated with regard to a half signal of a symmetrical audio signal so as to be converted to a simplified measurement.

To achieve the above described object, there is provided a method for automatically compensating a sound volume according to the present invention which includes a first step for determining whether a channel conversion key and an audio input switching key are inputted, a second step for producing an energy of an audio signal when the channel conversion key is inputted, and a third step for comparing an energy value of the audio signal detected for a predetermined time period with an energy value obtained from a previous step thereof and compensating for as much volume as a difference obtained by the comparison, thereby maintaining an absolute volume level.

Also, to achieve the above described object, there is provided a method for automatically compensating a sound volume according to the present invention which includes an input determination step for confirming whether an input mode of an audio signal is modified or a channel is modified, an energy production step for calculating an energy value of the input audio signal by predetermined cycles, and obtaining an average energy of the calculated energy value and an energy value obtained at a previous step thereof, an audio mode determination step for separating the input audio signal to an voiced interval and a voiceless interval, and determining whether the input audio signal is in a music mode or in a voice mode on the ground of the separated intervals, and a mode volume compensation step for calculating a compensated amount of the audio signal in consideration of an energy value produced in the energy production step and the audio mode, and carrying out a volume compensation in accordance with the collocated value.

Further, to achieve the above described object, there is provided an apparatus for automatically compensating a sound volume in a sound playback device which plays back sound with a provision of an external audio signal or an aerial audio signal according to the present invention, which includes a low-pass filter and amplifier for removing high frequency noise elements included in an input audio signal and amplifying the resultant signal to a predetermined level, an energy detecting unit for calculating an energy of the audio signal amplified in the low-pass filter and amplifier, a microcomputer for adding up an energy value of the audio signal obtained by the energy detecting unit for a predetermined time period, comparing the audio signal energy value with one obtained at a previous step thereof, and outputting a volume-compensated control signal corresponding to the compared resultant value, and a volume control unit for compensating an amplification rate of the input audio signal in accordance with the volume-compensated control signal.

Still further, to achieve the above described object, there is provided an apparatus for automatically compensating a sound volume in an audio device which amplifies and outputs a sound volume of an input audio signal in accordance with a user's requirement according to the present invention which includes a switching unit for transferring an input audio signal to an A/D converter when the input audio signal mode is converted or a broadcasting channel is switched, an energy detecting unit for receiving a digital audio signal outputted from the AID converter, and obtaining and accumulating therein an energy value of respective intervals by predetermined cycles, an audio mode determining unit for comparing energy values of the obtained respective intervals with a reference energy value, counting in accumulation the intervals determined as voiced and unvoiced in accordance with the compared resultant value, and determining an input audio signal mode on the ground of the accumulated count value, a compensated amount calculating unit for obtaining an entire energy of the input audio signal on the ground the number of the voiced intervals counted during the predetermined frame period, obtaining a difference of the obtained entire energy and the reference energy value, and calculating a volume-compensated value in accordance with the difference value and the determined audio mode, and a digital signal processing unit including amplifier for amplifying a volume of the audio signal outputted from the A/D converter by use of the volume-compensated value.

The object and advantages of the present invention will become more readily apparent from the detailed description given hereinafter. However, it should be understood that the detailed description and specific example, while indicating a preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Figure 2:
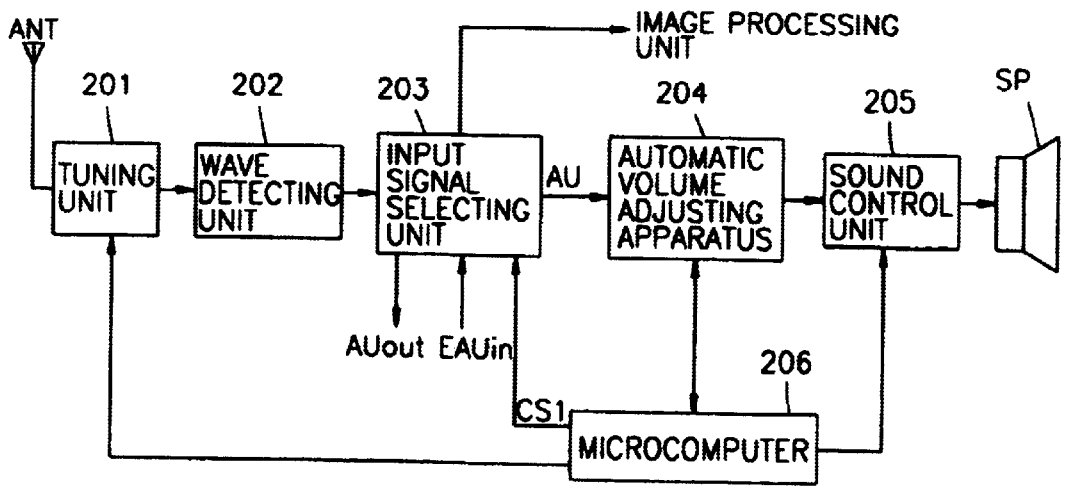
FIG. 2 is a block diagram illustrating an audio signal processing apparatus for a television set according to a preferred embodiment of the present invention.

FIG. 2 is a block diagram illustrating an audio signal processing apparatus for a television set according to a preferred embodiment of the present invention. As shown therein, the apparatus includes a tuning unit 201 for selecting a channel required by a user from a plurality of channels in accordance with high frequency broadcasting signals received through an antenna ANT, a wave detecting unit 202 for receiving an output signal of the tuning unit 201 and restoring a video signal and an audio signal, an input signal selecting unit 203 for outputting to an image processing unit the video signal received from the wave detecting unit 202 and outputting one selected from the audio signal outputted from the wave detecting unit 202 and an external audio signal $EAU_{in}$, an automatic volume adjusting apparatus 204 for accumulating an energy value of the audio signal AU outputted from the input signal selecting unit 203 when a channel is converted to another and an input signal is switched, so that the accumulated energy value is compared to that obtained from the previous step for thereby adjusting a volume of the input audio signal in accordance with the compared resultant, a voice control unit 205 for adjusting a sound volume of the audio signal AU output from the automatic volume adjusting apparatus 204 when a volume adjusting key is inputted by the user and outputting a resultant signal to a speaker SP, and a microcomputer 206 for controlling a tuning operation of the tuning unit 201, an input signal selecting operation of the input signal selecting unit 203 and a volume adjusting operation of the voice control unit 205.

Figure 3:
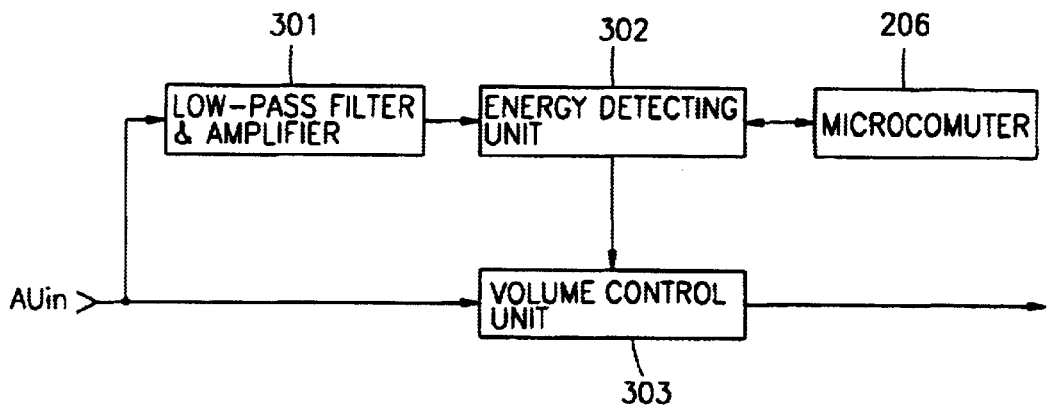
FIG. 3 is a block diagram detailing an automatic volume adjusting apparatus in the diagram of FIG. 2.

As shown in FIG. 3, the automatic voice adjusting apparatus 204 includes low-pass filter and amplifier 301, an energy detecting unit 302, a microcomputer 206 and a volume control unit 303.

The low-pass filter and amplifier 301 removes high frequency noise elements included in the input audio signal $AU_{in}$ and amplifies the noise-removed input audio signal to an appropriate level. The energy detecting unit 302 accumulates therein an energy of the audio signal outputted from the low-pass filter and amplifier 301 for a predetermined time period. The microcomputer 206 compares an energy value calculated in the energy detecting unit 302 with that of the previous step and outputs an volume control signal to output as much gain as the difference obtained by the comparison. The volume control unit 303 compensates the sound volume of the input audio signal in accordance with the volume control signal outputted from the microcomputer 206 and outputs the compensated value.

The operation and effects of the thusly constituted apparatus for automatically compensating a sound volume will now be described.

Figure 1:
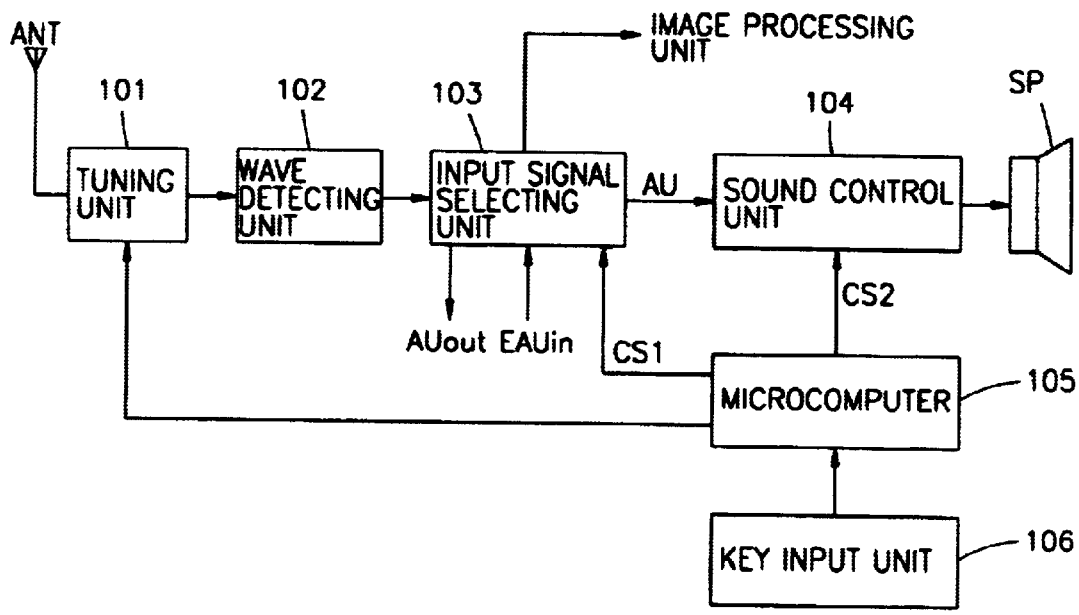
FIG. 1 is a block diagram illustrating a conventional audio signal processing apparatus for a television set.

The operational steps in FIG. 2 other than the automatic volume adjusting apparatus 204 are similar to the conventional ones in FIG. 1.

Specifically, a television audio signal of a channel selected through the tuning unit 201 and the wave detecting unit 202 is applied to an input terminal of the input signal selecting unit 203, and an external audio signal $EAU_{in}$ generated from a VCR, a CD player or an LD player is applied to another input terminal of the input signal selecting unit 203.

Then, the input signal selecting unit 203 outputs one selected from audio signals, that is, a broadcasting audio signal and the external audio signal $EAU_{in}$, in accordance with the control signal CS1 outputted from the microcomputer 206.

The automatic volume adjusting apparatus 204 accumulates therein the energy of the audio signal AU outputted from the input signal selecting unit 203 in predetermined periodic time order, and the resultant value is outputted to the microcomputer 206.

The microcomputer 206 compares the energy value of the audio signal AU applied thereto with that of the previous step, obtains the compared difference and outputs a volume compensating control signal having a level corresponding to the automatic volume adjusting apparatus 204 so as to output an absolute sound volume required by a user.

Therefore, the automatic volume adjusting apparatus 204 adjusts the volume being outputted to the voice control unit 205 in accordance with the volume compensating control signal, so that the volume previously required by a user can be maintained even when the input audio signal is converted in the input signal selecting unit 203, that is, when the input audio signal is converted from the broadcasting audio signal to the external audio signal $EAU_{in}$ or vise versa.

The method of obtaining energy of the audio signal AU from the automatic volume adjusting apparatus 204 is subject to variation. In consideration that an audio signal does not have a direct current component and has an alternate current signal with a symmetrical characteristic in reference level of zero, the present invention selects one of a positive (+) signal and a negative (−) signal, calculates a width and frequency of the signal passage through a predetermined threshold value, and obtains the energy of the original signal on the ground of the resultant value.

Meanwhile, when an energy of the voice output divided from the output terminal of the input signal selecting unit 203 is calculated to adjust the sound volume using the volume control unit 205, a volume compensation value has to be modified after a remembering process of the volume value set up by a user. Also, when there occurs a slight level compensation error, since the value may be accumulated, an additional automatic volume adjusting apparatus 204 is provided as shown in FIG. 2.

Figure 4:
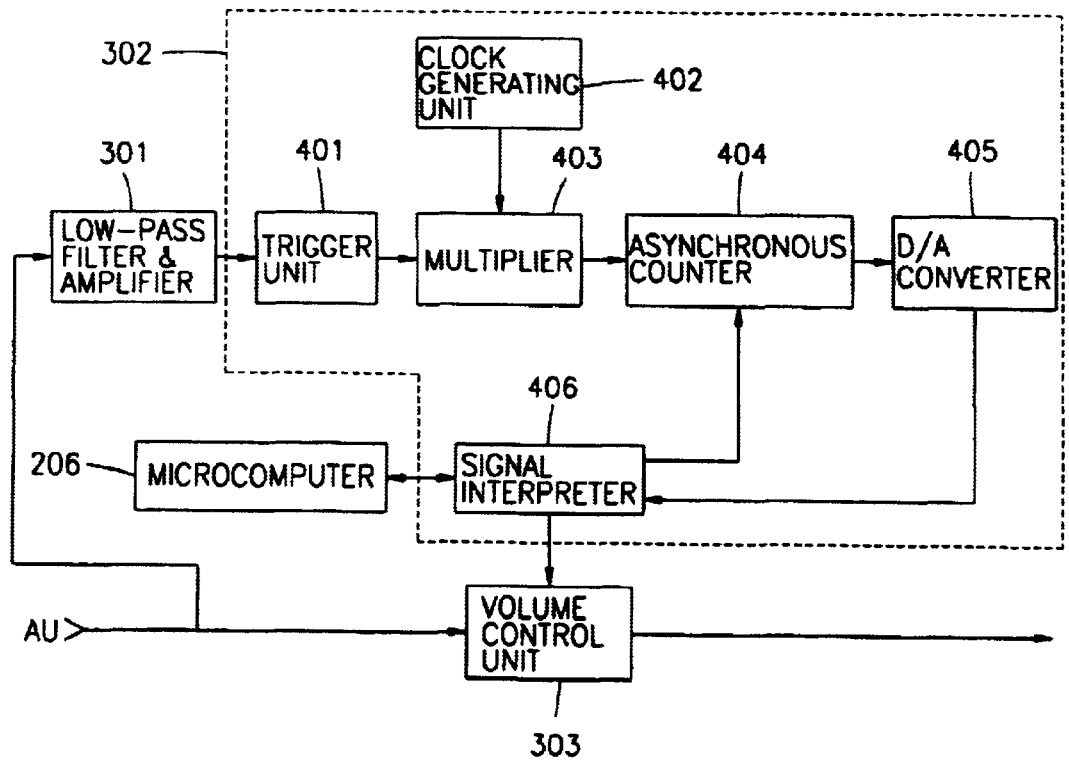
FIG. 4 is a block diagram detailing an energy detecting unit in the diagram of FIG. 3.

With reference to FIGS. 3 and 4, the respective operations of the automatic volume adjusting apparatus 204 and the microcomputer 206 for automatically compensating a sound volume will now be explained.

The low-pass filter and amplifier 301 receives the audio signal AU outputted from the input signal selecting unit 203 to remove noise elements included therein, so that the noise-removed signal in consideration of the auditory sensibility of human serves to process a frequency characteristic of an inverse function with a loudness curve.

Such a process is carried out because human is blunt to feel a high frequency and an audio system has a constant sensibility over a wider range of frequency bands so that the size of high frequency is decreased to operate as similar as human feels about a volume.

Also, the audio signal AU is weak in activation so that the low-pass filter and amplifier 301 has to be operable to have 20 times more gain so as to drive a trigger unit 401 in rear thereof.

Therefore, the low-pass filter and amplifier 301 is designed as a low band filter using a multiple sub-feedback, so that the filter is operated in a stable state, thereby sufficiently realizing three objects: noise removal, loudness curve, and amplifier function.

Figure 5A:
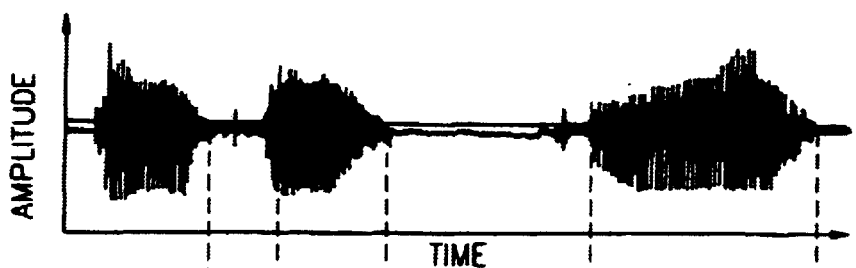
FIGS. 5A through 5D are timing diagrams of respective blocks in the diagram of FIG. 4.
Figure 5B:
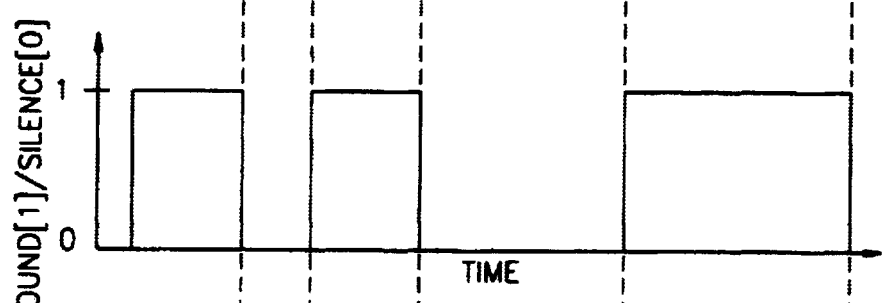
Figure 5C:
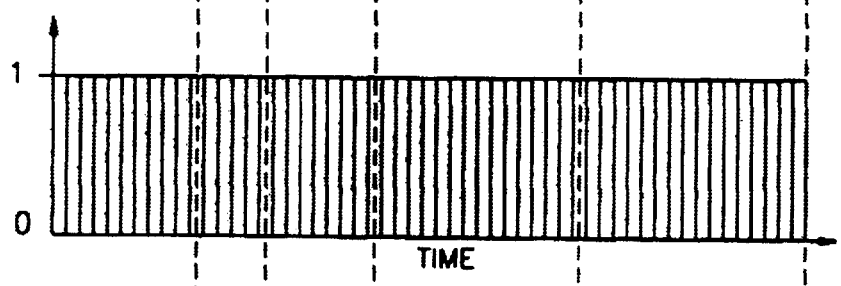

The audio signal outputted from the low-pass filter and amplifier 301, as shown in FIG. 5A, is provided to the trigger unit 401 to be converted to a square wave as shown in FIG. 5B. The thusly converted square wave is supplied to a multiplier 403 and multiplied by a clock signal, as shown in FIG. 5C, outputted from a clock generating unit 402. Here, in consideration of a width and frequency of the input audio signal, a clock signal having a much higher frequency than that of the audio signal is multiplied to the square wave so that a modulated wave loaded by a clock is outputted during a voiced interval in the multiplier 403. In the meantime, FIG. 5D is a timing diagram with regard to an output signal of the multiplier 403.

In order to employ a positive (+) region of the audio signal, a reverse amplifier may be applied; otherwise a non-reverse amplifier is applied.

The signal outputted from the multiplier 403 is applied as a clock signal to an asynchronous counter 404 to thereby increase its count value. Here, the count value accounts for an energy value of the audio signal.

Figure 5D:
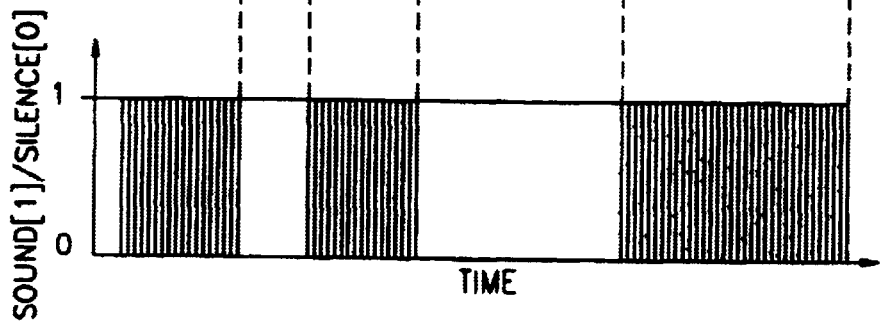

As shown in FIGS. 5B, 5C and 5D, a square wave is not generated in a soundless interval where an audio signal does not exist resulting from an multiplication process of the multiplier 403, whereas there is generated a square wave in a voiced interval where an audio signal exists, so that it is supplied as a clock signal to the asynchronous counter 404, thereby increasing a count value of the asynchronous counter 404.

The count value of the asynchronous counter 404 is converted to an analog signal through a D/A converter 405 and supplied to a signal interpreter 406. In order for the count value to be applied to an input terminal of the signal interpreter 406, there should be employed a parallel port and the that case a complicated structure of the apparatus is inevitable.

The signal interpreter 406 analyzes the audio signal on the ground of the energy value of the audio signal being applied thereto by being calculated through such steps as above for a predetermined time period, and the analyzed value is transferred to the microcomputer 206. Then, the asynchronous counter 404 becomes reset with a predetermined time of cycles.

At this time, the microcomputer 206 compares an energy value of the audio signal presently applied thereto with that previously applied thereto and obtains the difference so as to generate a volume compensating control signal with a level corresponding to the difference. The thusly generated volume compensating control signal is supplied through the signal interpreter 406 to the volume control unit 303.

Accordingly, the volume control unit 303 compensates an amplifying rate of the audio signal AU on the ground of the volume compensating control signal applied thereto and outputs the compensated value, whereby an absolute volume required by a user can be maintained as it is.

Figure 6:
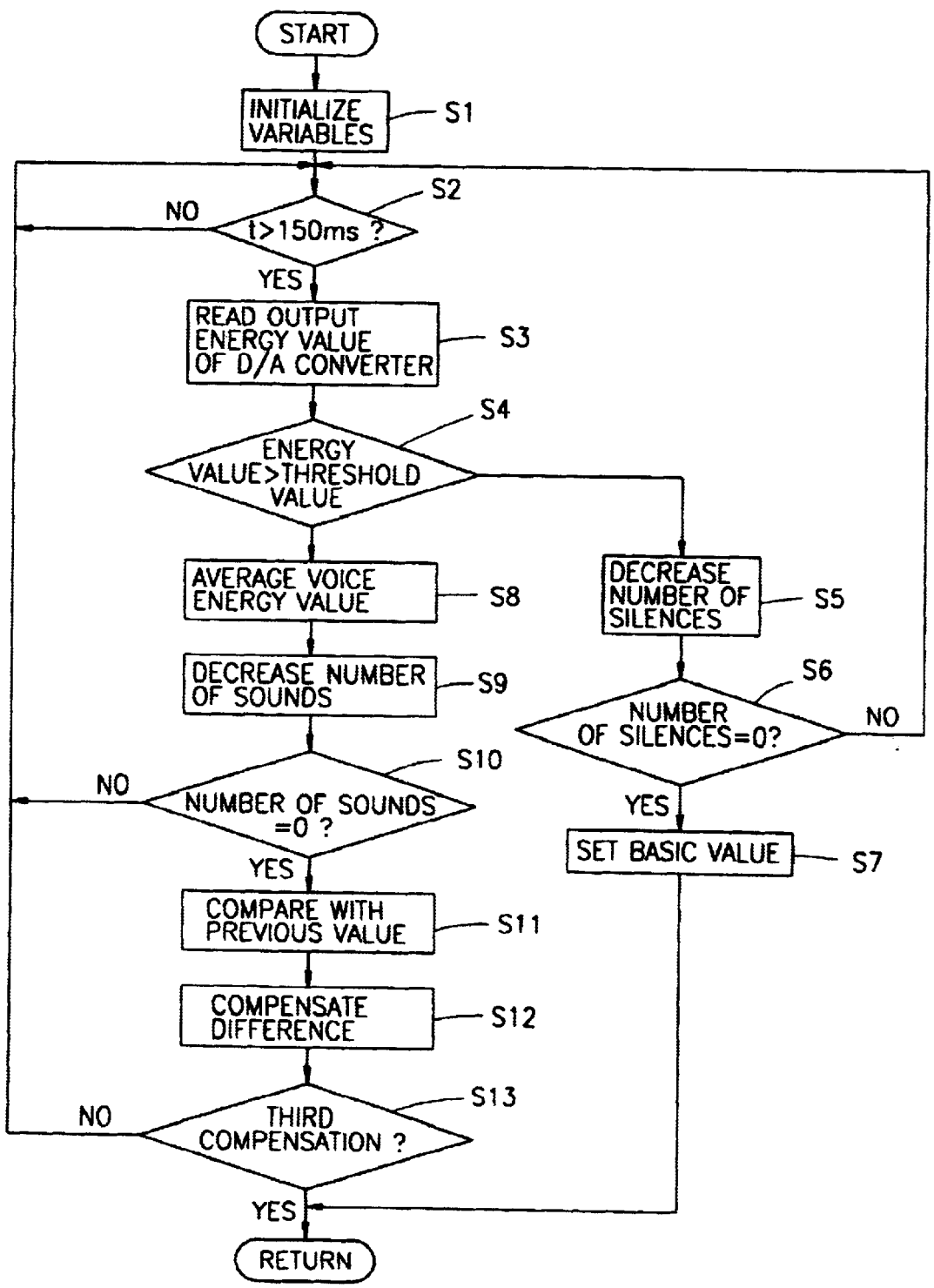
FIG. 6 is a flow chart illustrating an automatic volume adjusting apparatus according to the present invention.

FIG. 6 is a flow chart illustrating an automatic volume compensating method according to the present invention.

First, it is checked whether an input mode modification key, that is, a channel modification key is inputted or an audio input signal modification key is inputted, and when a desired key is not applied, a subsequent volume compensating process is carried out after waiting until the desired key is inputted.

With the conditions satisfied, once an initial state is configured for compensating the volume, respective variables are initialized which are to be employed for an automatic compensation, and it is checked whether a preset time t(=150 ms) has lapsed. Then, reads an energy value of the audio signal outputted from the D/A converter 405, and compare the read value with the previously set threshold value. If the read value or the energy value is larger than the threshold value, it is determined as a voiced internal; if less than the threshold value, it is determined as a voiceless interval (steps S1~S4)

The comparing operation is repeatedly carried out while confirming that the voiceless interval continues repetition for a predetermined time period, and when the conditions are satisfied, the volume is set as a basic value instead of waiting until the audio signal is inputted. (steps S5~S7) However, when there exists an voiced interval, the operation for accumulating energy values of the audio signals in the voiced interval. When a preset time lapses, the energy values accumulated for the preset time period, that is, the energy value of the present step is compared with that applied through the same steps as above in the previous step, and the volume is compensated for therein in accordance with the compared resultant values. (steps S8~S12)

In case the volume is compensated in such steps, when the number of preset voiced intervals is small, a subsequent error becomes large although the compensating time becomes small; otherwise the error becomes decreased although the compensating time becomes large.

In consideration of those factors, the present invention allows three compensations to be realized (step S13), since experimental results have shown more advantages in the three compensations than one elongated compensation. In addition, the compensation method itself has revealed a high reliability.

For example, a television broadcasting may generate a silent sound and a loud sound at a short instance, and accordingly if a channel conversion is carried out when compensating at a single time, a normal compensating operation may be performed. However, a moderate sound following a loud sound is compensated in a smaller one, whereas a moderate sound following a small sound tends to be further amplified, so that three consecutive operations of the one short time compensation is employed.

Figure 7:
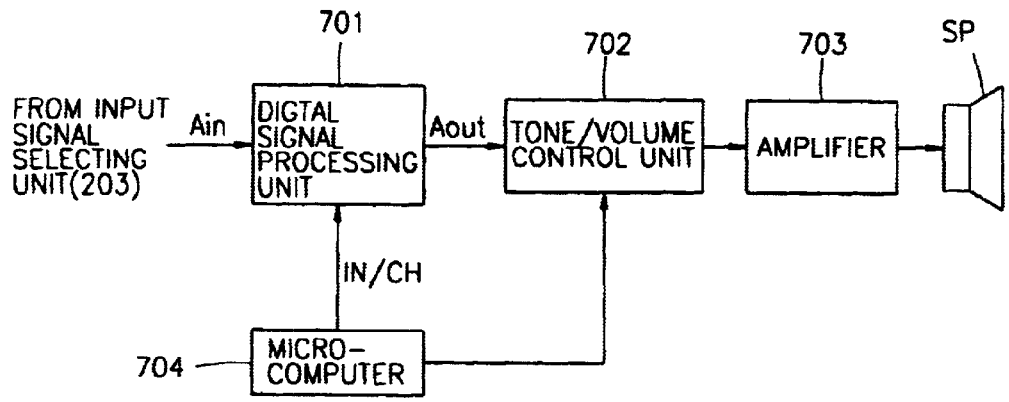
FIG. 7 is a block diagram detailing an automatic volume adjusting apparatus according to another preferred embodiment of the present invention.

FIG. 7 is a block diagram detailing an automatic volume adjusting apparatus according to another preferred embodiment of the present invention using a digital signal processing unit. As shown therein, the automatic volume adjusting apparatus includes a digital signal processing unit 701, a tone/volume control unit 702, an amplifier 703, and a microcomputer 704.

Figure 8:
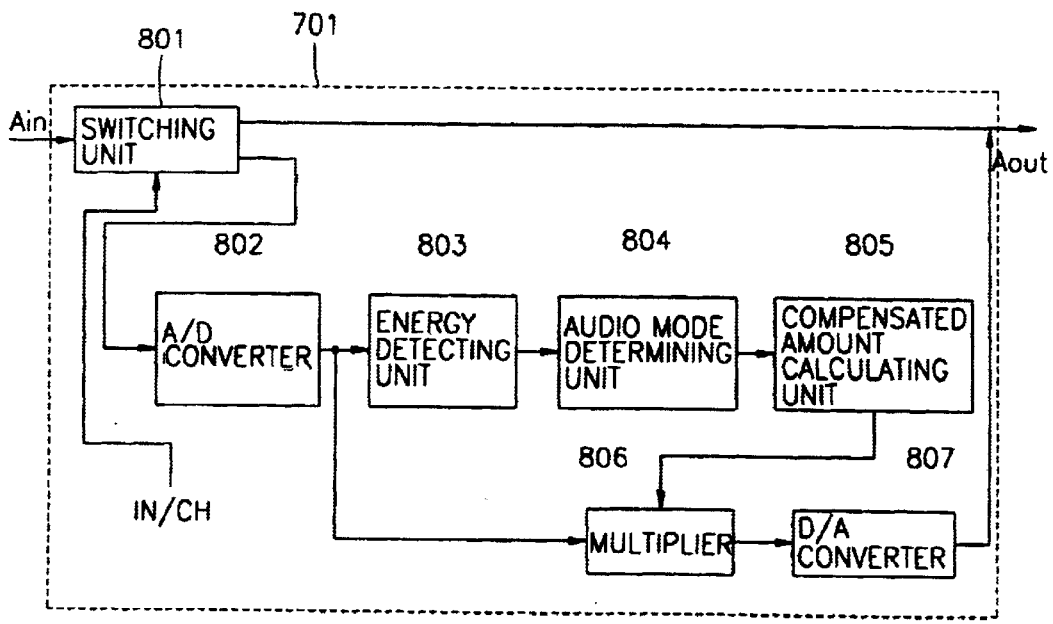
FIG. 8 is a block diagram detailing a digital signal processing unit in the diagram of FIG. 7.

The digital signal processing unit 701 periodically accumulates therein an energy value of an input audio signal $A_{in}$, calculates an entire energy value within a predetermined frame on the ground of energy values of respective intervals and at the same time determines whether the audio signal is in a music mode or a sound mode so as to be compensated to an absolute volume level required by a user. The tone/volume control unit 702 adjusts the tone and volume of the audio signal $A_{out}$ outputted from the digital signal processing unit 701 under the control of the microcomputer 704. The amplifier 703 amplifies the audio signal outputted from the tone/volume control unit 702 to a level appropriate to the operation of speaker SIP. The microcomputer 704 control the operation of the digital signal processing unit 701 in order to set the output volume level to an absolute level required by a user, when a broadcasting channel is modified or an input mode is switched. As shown in FIG. 8, the digital signal processing unit 701 includes a switching unit 801, an A/D converter 802, an energy detecting unit 803, an audio mode determiner 804, a compensated amount counting unit 805, a multiplier 806, and a D/A converter 807.

The switching unit 801 transmits the input audio signal to the A/D converter 802 or bypasses depending upon the input of an input mode conversion signal IN or a channel conversion signal CH. The energy detecting unit 803 receives the audio signal converted to the digital signal in the A/D converter 802, obtains energy values of respective intervals in predetermined cycles, and accumulates the resultant value therein. The audio mode determiner 804 compares the obtained energy value of the respective intervals with a reference energy value, counts while accumulating the intervals determined as voiced or voiceless depending upon the compared results. The compensated amount counting unit 805 obtains the entire energy of the input audio signal on the ground of the number of the voiced intervals counted by accumulation during the predetermined frame period, obtains the difference of the obtained entire energy and the reference energy, and calculates the volume compensated value in accordance with the difference and the determined audio mode. The multiplier 806 employs the volume compensated value obtained from the compensated amount counting unit 805 and amplifies the volume of the audio signal outputted from the A/D converter 802. The D/A converter 807 converts the digital audio signal outputted from the multiplier 806 to an analog audio signal.

The operation of the other preferred embodiment of the present invention will now be described with reference to FIGS. 9, 9a and 10.

Under the demand of a user, when the audio signal selected in the input signal selecting unit 203 in FIG. 2 is applied to the digital signal processing unit 701, the digital signal processing unit 701 yields the energy of the input audio signal $A_{in}$ and obtains the volume energy value by a method of accumulation counting, and then compares the obtained value with the volume energy value obtained from the previous step so as to determine the extent of the volume variation.

Also, it is determined whether the input audio signal $A_{in}$ is generated from a music mode or from a sound mode so as to calculate the compensated value depending the determined mode. Then, the output volume is compensated to an absolute volume level required by a user and the compensated value is outputted accordingly.

The audio signal outputted from the digital signal processing unit 701 is outputted to the speaker SP through the tone/volume control unit 702 and the amplifier 703.

Therefore, a user is allowed to listen to a selected program with a volume level previously set by the user without regard to the modification of the input audio signal.

At this time, the microcomputer 704 confirms the switching of broadcasting channels in the tuning unit 201 or the switching of the input mode by the input signal selecting unit 203 and outputs the input mode conversion signal IN or the channel conversion signal CH to the digital signal processing unit 701, whereby the digital signal processing unit 701 serves to compensate the volume level over predetermined number times (for example, three times).

Also, the microcomputer 704 outputs a corresponding control signal to the tone/volume control unit 702 when a user requires an adjustment of a tone or a volume (sound amount) through a remote control or a separate key input unit, thereby enabling the adjustment of the tone or the volume.

With reference to FIG. 8, the operation of the digital signal processing unit 701 will now be described in further detail.

When the broadcasting channels are not converted or when an input line of the audio signal is not switched in the input signal selecting unit 203, the input mode conversion signal IN or the channel conversion signal CH is not outputted from the microcomputer 704 to the switching unit 801 so that the audio signal $A_{out}$ outputted from the input signal selecting unit 203 becomes bypassed through the switching unit 801.

However, when the channels are converted by a user or when a input line of the audio signal is switched in the input signal selecting unit 203, the input mode conversion signal IN or the channel conversion signal CH are supplied from the microcomputer 704 to the switching unit 801. Accordingly, the switching unit 801 is switched so that the audio signal $A_{out}$ outputted from the input signal selecting unit 203 is provided through the switching unit 801 to the A/D converter 802 to be converted to a digital signal. Then, the digital signal is applied to the multiplier 806 and at the same time to the energy detecting unit 803.

The energy detecting unit 803 repeatedly obtains a valid energy value of the audio signal applied thereto by 15 ms (1 frame) cycle as an example of a predetermined cycle, and the audio mode determiner 804 compares the energy value obtained at the cycle (15 ms) with the reference energy value (par1). When the reference energy value (par1) is less than the obtained energy value, it is determined as a voiceless interval; when the reference energy value (par1) is larger than the obtained energy value, it is determined as a voiced interval, thereby counting the respective numbers of the voiced intervals and the voiceless intervals in accumulation.

Also, the audio mode determiner 804 compares the voiced intervals counted with the reference value in accumulation for 30 frames (450 ms). When the number of the voiced intervals is larger than the reference value, the audio signal being presently received is determined as a music mode, and when the number of the voiced intervals is smaller than the reference value, the audio signal being presently received is determined as a sound mode.

The compensated amount counting unit 805 obtains an audio signal applied thereto on the ground of the number of the voiced intervals counted in accumulation over 30 frames, and obtains the difference of the previously obtained volume and one required by a user, and then determines the volume compensated value in accordance with the determined audio mode, thereby controlling the amplifying rate of the multiplier 806.

The thusly volume-compensated audio signal is converted to an analog signal again through the D/A converter 807 and then transferred to the tone/volume control unit 702.

Therefore, irrespective of the switching of channel or the switching of the input mode of the audio signal, the user can listen in a volume level set thereby.

Figure 9:
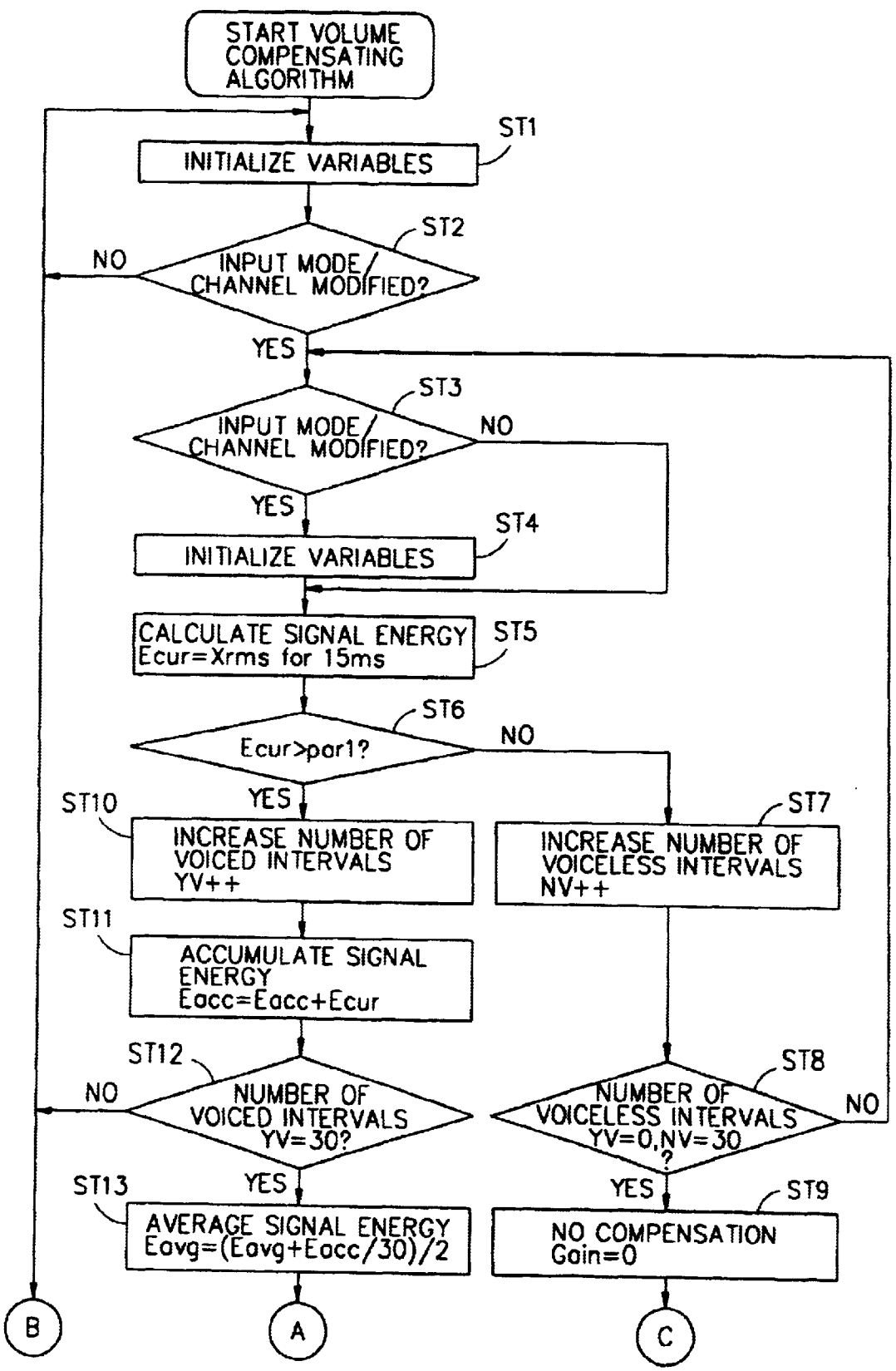
FIG. 9 is a flow chart illustrating an automatic volume compensating method according to the other preferred embodiment of the present invention.

FIG. 9 is a flow chart illustrating an automatic adjustment of a volume to an absolute level required by a user in the digital signal processing unit 701. As shown therein, channels are converted or an input line of the audio signal is switched in the input signal selecting unit 203, by a user, and when the input mode conversion signal IN or the channel conversion signal CH is supplied from the microcomputer 704 to the digital signal processing unit 701, there begins a volume compensating algorithm.

At this time, the variables (for example, number of voiced sounds, number of voiceless sounds, present energy accumulating values, gain etc.) employed in the algorithm are initialized. (step ST1)

In a state in which the volume-compensating algorithm is initiated, the variables are initialized during a channel modification, and once the channels are modified, the other channels are initialized again. (steps ST2~ST4).

A step (ST3) for confirming a second channel modification is to calculate an energy value of the input audio signal when the channels are modified within the 30 frames.

Then, a valid energy value Xrms of the input audio signal is calculated by 15 ms cycle under the accompanying equation. Such a calculating operation is continuously carried out. The thusly calculated energy value (Ecur) is compared with the reference energy value (par1) so as to determine the voiced sound and voiceless sound, and accordingly when the energy value Ecur is larger than the reference energy value par1, it is determined as voiced interval; when smaller, it is determined as voiceless interval. (step ST5, ST6)

$$Xrms = \sqrt{\int_T x^2(t)dt} = \sqrt{\frac{\sum x_n^2}{Fs}}$$

wherein, T=15 ms, $$Fs = \text{(sampling frequency at A/D conversion)} \times \frac{15}{60} \times 10^{-3}.$$

Here, each time when the voiceless interval is determined, a count value of the voiceless interval counter is counted in accumulation, and when the number of voiced intervals is "0", it is determined that there is no sound for thereby discontinuing the volume compensation. (steps ST7~ST9)

Also, each time when the voiced interval is determined, a count value of the voiced interval counter is counted in accumulation, and the energy value of the audio signal is calculated in accumulation.

In the meantime, when the count value reaches up to "30" or 30 frames, an average value of the energy value obtained over the 30 frames through the previous steps and the energy value obtained over the 30 frames through the present steps. (steps ST10~ST13)

The reason for obtaining an average value of the present step and the previous step is to minimize the compensation error. That is, once the volume is compensated by 30 frames cycle, there is carried out a compensation for the entire time, thereby enabling a more accurate compensation.

Then, it is determined whether the audio mode is a music mode or a sound mode, and in order to differentiate the volume-compensated value depending on the determined mode, the number of voiceless intervals NV is compared with the reference value Par2 for determining the sound modes. (step ST14)

Likewise, determining whether the audio mode is a music mode or a sound mode is based upon that the audio signal in a sound mode has many voiceless intervals but the audio signal in a music mode has a relatively few voiceless intervals.

Also, the reason for separating the audio mode is attributable to a fact in which the music mode has a fewer number of voiceless intervals due to a low valid energy value as compared to the sound mode. Accordingly, in case of music, its output is relatively small in comparison to sound with regard to the input signal having identical energy values.

Eventually, in consideration of those characteristics, a compensation reference is differently set with regard to the two modes, thereby equalizing the volume levels of the final output without regard to the modes.

In order to obtain a volume-compensated value, that is, a variable amplified gain in accordance with a mode of the present input audio signal, there is obtained a difference of an average energy value obtained during a corresponding time period prior to the modification of the channels and the input modes, and an average value Eavg of the energy obtained from step ST13. The obtained difference is multiplied by unit amplify value Par3 or unit amplify value Par4 according to the previously determined mode. (steps ST15, ST16)

That is, at a voice mode, the difference is multiplied by the unit amplify value Par3, and at a music mode, the difference is multiplied by unit multiply value Par4 so as to obtain the variable amplified gain.

The thusly obtained variable amplified gain is added by "1", and the resultant value is multiplied by an input signal X to thereby obtain a volume-compensated output signal Y. (step ST17)

Respective variables are initialized following the volume compensation. At this time, the remaining variables except the entire accumulated values are initialized. (step ST18)

The volume compensation steps are performed through a predetermined number of times (for example, three times), then it is restored to the first step ST1, thereby initializing all the variables. (step ST19)

Figure 10:
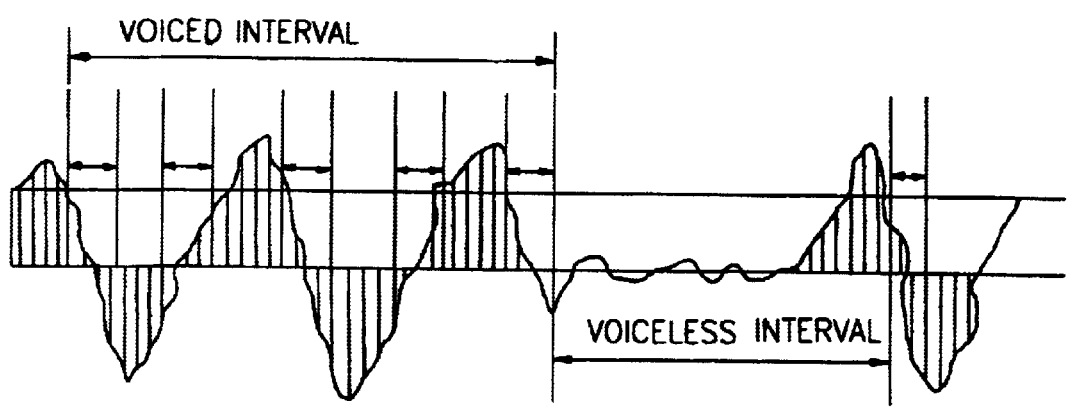
FIG. 10 is a timing diagram illustrating a data sampling and a determination example of voiced and voiceless intervals.

FIG. 10 is a timing diagram for sampling data and determining voiced intervals and voiceless intervals.

Figure 9A:
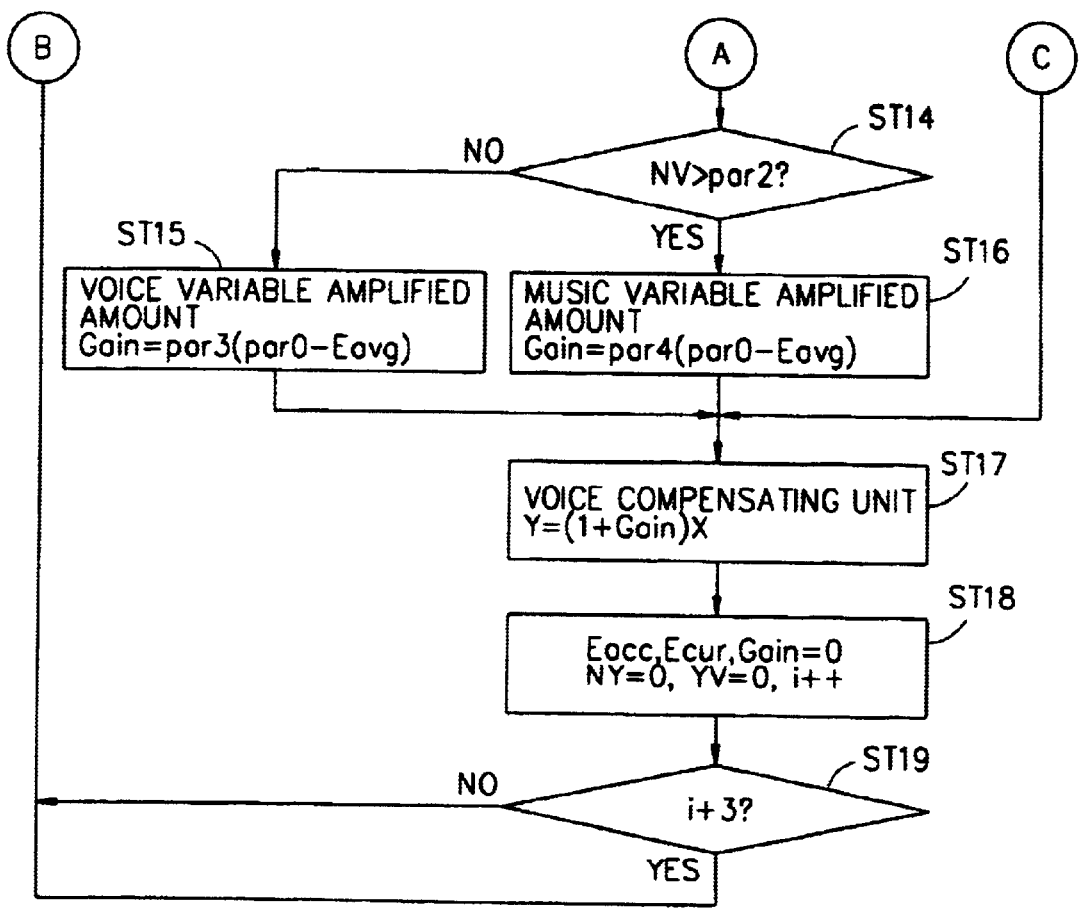
FIG. 9a is a continuation of the flow chart (shown in FIG. 9) illustrating an automatic volume compensating method according to the other preferred embodiment of the present invention.

In FIGS. 9 and 9a, YU denotes number of voiced sounds, and NV denotes number of voiceless sounds. Also, i, Ecur, Eacc, Eavg, Gain are variables, and Par0–Par4 are parameters.

As described above, the present invention considers a symmetrical characteristic of an audio signal, calculates a voice energy with regard to a half signal of the audio signal, converts the calculated signal to a simplified value, and automatically compensates for the volume accordingly, thereby removing redundant manual steps which have been required to readjust volume by a user when converting channels or input signals.

Further, in consideration of the loudness curve, a volume compensation is carried out in accordance with human auditory characteristics which vary depending on frequency bands, thereby providing an appropriate sound volume to human.

Still further, the present invention enables a user to maintain an absolute volume with accuracy regardless of conversion of input audio signal modes, by compensating the volume by obtaining an input audio signal energy value and determining an audio signal mode.

As the present invention may be embodied in several forms without departing from the spirit of essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within meets and bounds of the claims, or equivalences of such meets and bounds are therefore intended to embrace the appended claims.

What is claimed is:

1. A method for automatically compensating a sound volume, comprising:

determining whether a channel conversion key or an audio input switching key is inputted;

low-pass filtering and amplifying an input audio signal, wherein the frequency characteristic of the low-pass filtering is an inverse function of a loudness curve;

producing an energy value of the audio signal when the channel conversion key or the audio input switching key is inputted;

comparing an energy value of the audio signal detected for a predetermined time period with an energy value obtained at a previous step thereof and compensating for any volume difference obtained by the comparison; and determining voiced intervals and voiceless intervals with regard to the audio signal and counting the voiced intervals and the voiceless intervals in accumulation in order to differentiate a sound volume compensated value depending on a determined mode.

2. The method of claim 1, wherein the method for automatically compensating a sound volume further comprises determining a voiced interval and a voiceless interval with regard to the audio signal.

3. The method of claim 1, wherein the method for automatically compensating a sound volume further comprises outputting a basic volume when the voiceless interval is maintained for a predetermined time period.

4. An apparatus for automatically compensating a sound volume in a sound playback device which plays back sound with a provision of an external audio signal or an aerial audio signal, comprising:

a low-pass filter and amplifier for removing high frequency noise elements included in an input audio signal and amplifying the resultant signal to a predetermined level, wherein the frequency characteristic of the low-pass filter is an inverse function of a loudness curve;

an energy detecting unit for calculating an energy of the audio signal amplified in the low-pass filter and amplifier;

a microcomputer for adding up an energy value of the audio signal obtained by the energy detecting unit for a predetermined time period, comparing the audio signal energy value with one obtained at a previous step thereof, and outputting a volume-compensated control signal corresponding to the compared resultant value; and a volume control unit for compensating an amplification rate of the input audio signal in accordance with the volume-compensated control signal;

wherein the energy detecting unit comprises
- a trigger unit for converting the input audio signal to a square wave signal;
- a multiplier for multiplying a clock signal to the spherical wave signal and generating a clock-loaded modulation wave signal only for the voiced internal;
- an asynchronous counter for counting an output signal of the multiplier;
- a D/A (digital/analog) converter for converting an output value of the asynchronous counter to an analog signal; and
- a signal interpreter for analyzing the input audio signal applied for a predetermined time period on ground of an energy value of an audio signal outputted from the D/A converter, and resetting the asynchronous counter at respective intervals thereof.

5. A method for automatically compensating a sound volume, comprising:
- an input determination step for confirming whether an input mode of an audio signal is modified or a channel is modified;
- a signal processing step for low-pass filtering and amplifying the input audio signal, wherein a frequency characteristic of the low-pass filtering is an inverse function of a loudness curve;
- an energy production step for calculating an energy value of the input audio signal by predetermined cycles, and obtaining an average energy value of the calculated energy value and an energy value obtained at a previous step thereof;
- an audio mode determination step for separating the input audio signaling to voiced intervals and voiceless intervals, counting the voiced intervals and the voiceless intervals in accumulation, and determining whether the input audio signal is in a music mode or in a voice mode on the ground of the accumulated counted voice intervals and voiceless intervals; and
- a mode volume compensation step for calculating a compensated amount of the audio signal in consideration of an energy value produced in the energy production step and the audio mode, and carrying out a volume compensation in accordance with the calculated value.

6. The method of claim 5, wherein e energy production step comprises:
- a step for calculating an energy by separating the input audio signal to a predetermined number of frame units;
- a step for separating the input audio signal by predetermined cycles, obtaining an energy value of the respective cycles, comparing the obtain energy value with a reference value, and determining the voiced internal and the voiceless interval;
- a step for obtaining an entire energy when the number of voiced intervals within the predetermined number of frame units is larger than a predetermined value; and
- a step for obtaining an average energy when the number of voiced intervals within the predetermined number of frame units is larger than a predetermined value.

7. The method of claim 5, wherein the mode volume compensation step further comprises a step for performing the steps from the input determination step to the mode compensation step as many as a predetermined number of times.

8. An apparatus for automatically compensating a sound volume in an audio device which amplifies and outputs a sound volume of an input audio signal in accordance with a user's requirement, comprising:
- a switching unit for transferring an input audio signal to an A/D converter when the input audio signal mode is converted or a broadcasting channel is switched;
- an energy detecting unit for receiving a digital audio signal outputted from the A/D converter, and obtaining and accumulating therein an energy value of respective intervals by predetermined cycles;
- an audio mode determining unit for comparing energy values of the obtained respective intervals with a reference energy value, counting in accumulation the intervals determined as voiced and unvoiced in accordance with the compared resultant value, and determining an input audio signal mode on the ground of the accumulated count value;
- a compensated amount calculating unit for obtaining an entire energy of the input audio signal on the ground of the number of the voiced intervals counted during the predetermined frame period, obtaining a difference of the obtained entire energy and the reference energy value, and calculating a volume-compensated value in accordance with the difference value and the determined audio mode; and
- a digital signal processing unit including a multiplier for multiplying a volume of the audio signal outputted from the A/D converter by use of the volume-compensated value.

* * * * *